United States Patent [19]
Butler et al.

[11] Patent Number: 5,495,447
[45] Date of Patent: Feb. 27, 1996

[54] METHOD AND APPARATUS USING MAPPED REDUNDANCY TO PERFORM MULTIPLE LARGE BLOCK MEMORY ARRAY REPAIR

[75] Inventors: Steven W. Butler, Marlboro, Mass.; Hamid Partovi, Mountain View, Calif.

[73] Assignee: Digital Equipment Corporation, Maynard, Mass.

[21] Appl. No.: 342,405

[22] Filed: Nov. 18, 1994

Related U.S. Application Data

[63] Continuation of Ser. No. 133,498, Oct. 8, 1993, abandoned.

[51] Int. Cl.⁶ .................................................. G11C 7/00
[52] U.S. Cl. ................ 365/200; 365/230.03; 395/185.07
[58] Field of Search ............................... 365/200, 230.03; 371/10.1, 10.2, 10.3

[56] References Cited

U.S. PATENT DOCUMENTS

| | | | |
|---|---|---|---|
| 4,757,474 | 7/1988 | Fukushi et al. | 365/200 |
| 4,803,656 | 2/1989 | Takemae | 365/200 |
| 5,126,973 | 6/1992 | Gallia et al. | 365/200 |
| 5,146,429 | 9/1992 | Kawai et al. | 365/200 |
| 5,179,536 | 1/1993 | Kasa et al. | 365/200 |
| 5,278,793 | 1/1994 | Yeh | 365/200 |
| 5,307,316 | 4/1994 | Takemae | 365/200 |

*Primary Examiner*—David C. Nelms
*Assistant Examiner*—Vu A. Le
*Attorney, Agent, or Firm*—Lindsay G. McGuinness; Denis G. Maloney; Arthur W. Fisher

[57] ABSTRACT

A semiconductor memory device according to the invention includes a main memory comprising a number of memory sub-arrays, each coupled to an address and a data bus, for providing or receiving data to an intermediate interface unit. The intermediate interface unit provides data to and receives data from an output bus. Also included in the semiconductor memory device is redundancy circuit including a redundant memory coupled to the output bus for storing a subset of data from one of the sub-arrays in the event that the sub-array is defective. The redundancy circuit additionally includes address fuses for storing the sub-array addresses of the subset of data to be stored in the redundant storage, and compare circuitry coupled to the address bus for comparing the address bus to the stored array addresses to determine if there is a match. In the event of a match, the compare circuitry provides an index to the redundant storage unit and enables it to provide data to or receive data from the output bus, while precluding the intermediate interface from providing data from the main memory array to the output bus.

8 Claims, 3 Drawing Sheets

METHOD AND APPARATUS USING MAPPED REDUNDANCY TO PERFORM MULTIPLE LARGE BLOCK MEMORY ARRAY REPAIR This application is a continuation of application Ser. No. 08/133,498, filed Oct. 8, 1993, now abandoned.

BACKGROUND OF THE INVENTION

This invention relates in general to semiconductor memory devices, and more particularly to semiconductor memory devices including redundant cells for replacing faults within the memory device.

As it is known in the art, in the fabrication of semiconductor memory devices it is common for a memory device to include defects which prevent it from proper operation. These defects may include short circuits between adjacent columns or rows or open circuits within individual columns or rows of the memory device, as well as non-functional clusters of cells.

These types of defects may be easily identified by a testing procedure after fabrication. A semiconductor memory device with a defect is inoperable, and would have to be discarded. Generally, however, the semiconductor memory devices have been designed to include a redundancy circuit having a number of redundant cells to replace the defective memory cells.

Typically two types of redundancy have been provided. One type is row redundancy. In memory devices which provide row redundancy, the memory device is apportioned into a discrete number of blocks. For each block, an extra set of rows are provided (at least one pair). If, during testing, it is discovered that a row or two adjacent rows or a cluster of cells within the pitch of a pair of rows in a block is defective, the redundant set for the block is substituted for the defective cells. To activate the redundant circuitry, appropriate fuses are included for programming individual decoder circuits to be responsive to the addresses of the defective set of rows.

There are a number of drawbacks with providing only row redundancy. The first drawback is that it is ineffective against bit-line failures, that is when an entire column of the semiconductor memory device fails. The second drawback is that although at least a pair of rows is often provided as the redundant set for the block, that set may be ineffective to provide sufficient replacement capability for large clustered defects.

A second type of redundancy is to provide redundant columns in the semiconductor memory device. Depending on the width of the memory device, at least a pair of redundant columns is allocated to a predetermined number of columns. For example, a memory array having a 64 bit data path may provide a redundant column pair for each byte of information, thereby providing 8 redundant column pairs. Although column redundancy provides a technique for replacing bit-line failures, a drawback of having redundant columns is that it is difficult to design and does not make optimal use of the available semiconductor area.

Row and column redundancy often need to be distributed throughout the entire memory device, and therefore the total amount of redundancy available in each semiconductor memory device is limited by the desired number of die per wafer. When the amount of available redundancy is spread evenly throughout the semiconductor device, each segment of the memory ends up with a very limited amount of redundant space. This would be adequate if defects in the semiconductor device where likewise evenly distributed. However, processing defects have a clustering characteristic and failures tend to occur within a close distance of each other. Thus, small amounts of distributed redundancy often cannot replace clustered defects.

SUMMARY OF THE INVENTION

In accordance with the present invention, a semiconductor memory device includes a memory array comprising a plurality of sub-arrays each sub-array having a plurality of rows and columns. Each sub-array is coupled to an address bus and a data bus. The memory device further includes means, coupled to the data bus, for providing said data to an output bus. In addition, the memory device includes means, coupled to the output bus, for storing a subset of data from one or more of the sub-arrays in the event that a sub-array is defective, and for providing substitute data to the output bus when that subset of data is accessed. With such an arrangement, the addressing of the redundancy means and the memory device are separated, thus allowing for more flexible redundancy mechanisms which may include block replacement, small strand replacement, or row replacement depending upon how the redundancy circuit is arranged. In addition, with such an arrangement, the redundant storage can be arranged such that the redundant circuitry may be placed in any available die location.

BRIEF DESCRIPTION OF THE DRAWINGS

The above-mentioned and other features of the invention will now become more apparent by reference to the following description taken in connection with the accompanying drawings in which.

DETAILED DESCRIPTION OF THE PREFERRED EMBODIMENT

Figure 1:
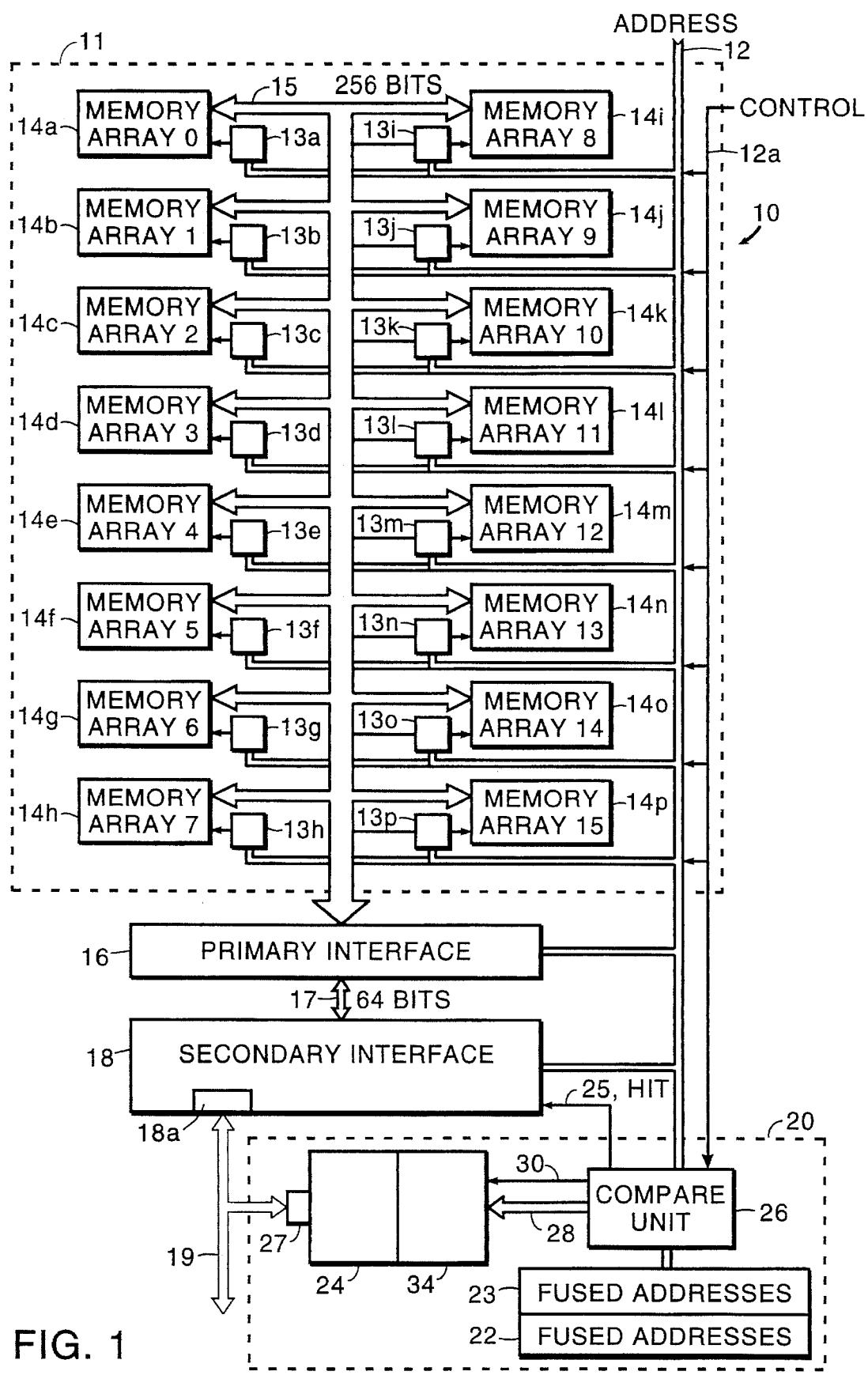
FIG. 1 is a block diagram of a semiconductor memory device including a redundancy circuit according to the invention.

Referring now to FIG. 1, an illustrative 64K×4 bit semiconductor memory device 10 is shown to include a memory array 11 (shown by dashed lines in FIG. 1) which is physically divided into a plurality of sixteen memory sub-arrays 14a–14p, each sub-array comprising 64 rows and 256 columns worth of storage for data. An address bus 12 provides an address to decoder circuits 13a–13p. A control bus 12a provides read and write control signals to decoder circuits 13a–13p. Each decoder circuit 13a–13p is coupled to a memory sub-array to provide enable signals to the sub-array. When there is a match between the address on address bus 12 and the address of one of the memory sub-arrays 14a–14p, the appropriate sub-array provides an entire row of data to a 256 bit bus 15.

The semiconductor memory device 10 also includes a primary interface 16 and a secondary interface 18. The primary interface 16 includes amplifier circuits (not shown) to drive the address from address bus 12 to perform a 4:1 multiplex operation for muxing the 256 bit bus 15 down to a 64 bit bus 17, while the secondary interface uses the appropriate bits from address bus 12 to perform a 16:1 multiplex operation for muxing the 64 bit bus 17 to 4 bits. The secondary interface 18 also includes output drivers 18a which drive the 4 bits onto the internal input/output bus 19.

Semiconductor memory device 10 additionally includes a memory redundancy circuit 20 for replacing defective locations in memory sub-arrays 14a–14p by providing substitute memory locations which may be accessed for read and write purposes in place of the defective locations. The memory redundancy circuit 20 includes two fusible address fields 22 and 23 comprising a plurality of fusible devices (not shown). The fusible address fields 22 and 23 store a number of bits indicating locations in at least one of the sub-arrays of memory array 11 for which there is redundant storage. Two redundant storage units 24 and 34 are provided for storing data in the event that there are multiple defects in the memory array 11. A compare unit 26 compares the address on address bus 12 with the information provided from the fusible address fields 22 and 23 to determine whether there is a match between the address on the bus 12 and the address stored in fusible address fields 22 or 23. The redundant circuitry 20 also includes drivers 27, coupled to the internal input/output bus 19 for communicating with that bus.

If there is a match between the address of address bus 12 and the address provided in the fusible address fields 22 or 23, the compare unit 26 sends a HIT signal 25 to the secondary interface to preclude it from driving the 4 bits of data onto the input/output bus 19 by disabling the output drivers 18a in the secondary interface 18. The compare unit 26 provides an index on bus 28 and control signals on bus 30 to the redundant storage units 24 and 34 and the input/output drivers 27 to allow the redundancy circuit 20 to either drive the bus 19 for a read operation, or to receive the data from bus 19 for a write operation. Here, the index bus 28 is a subset of the bits from address bus 12 and the control signals on bus 30 are the same control signals which are provided to the memory array 11.

Figure 2A:
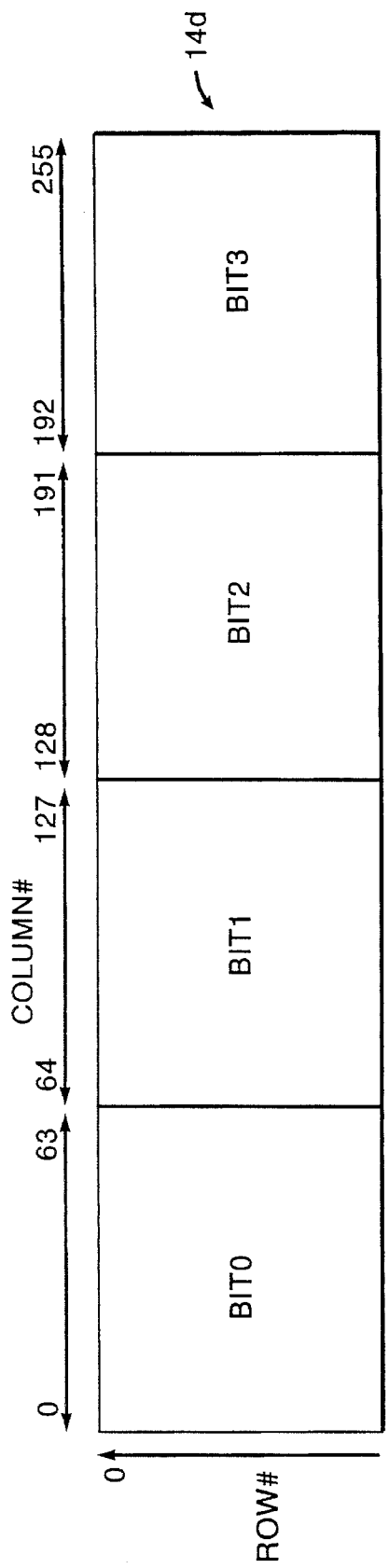
FIG. 2A illustrates the layout of a memory sub-array of the semiconductor memory device of FIG. 1.

Referring now to FIG. 2A, one of the 64 row×256 column memory sub-arrays, here memory sub-array 14d from the semiconductor memory device 10 (FIG. 1), is shown partitioned such that 64 columns are allocated for each logical bit. As mentioned previously, in addressing the array, an entire row of 256 bits is provided, which is first multiplexed down to 64 bits, comprising 16 bits from each of the 4 data bit partitions of the memory sub-array 14d. A second multiplexing operation selects one of the sixteen bits from each data bit partition to provide the correct data bit to the input/output bus 19 (FIG. 1).

Following fabrication of a semiconductor memory device 10, a testing procedure is performed. The test procedure generally performs consecutive write and read operations of different data patterns to determine if any locations of any of the memory sub-arrays are defective. The defect may be caused by a short circuit or an open circuit between columns or rows, or single cell or multiple cell clustered failures, for example. As technology advances, and with transistor miniaturization, a given defect size will destroy a larger number of cells, thereby increasing the occurrence of clustering failures.

Once defective cells are identified during testing, the redundancy circuit 20 is configured so that addresses of the defective cells map to portions of redundant memory. The redundancy circuit 20 includes storage devices 24 and 34, each for storing data from defective memory locations corresponding to one defect in a sub-array. Therefore, for a given memory array 11, the redundant circuitry described here is capable of providing redundant storage for two independent clusters of defective cells. The two clusters of defective cells may be in the same sub-array, or in two different sub-arrays. The configuration of redundant storage 24 and 34 is accomplished by fusing the appropriate bit values of the fusible address field 22 or 23. The mapping may be performed to provide either column redundancy or row redundancy or both concurrently as needed.

Figure 2B:
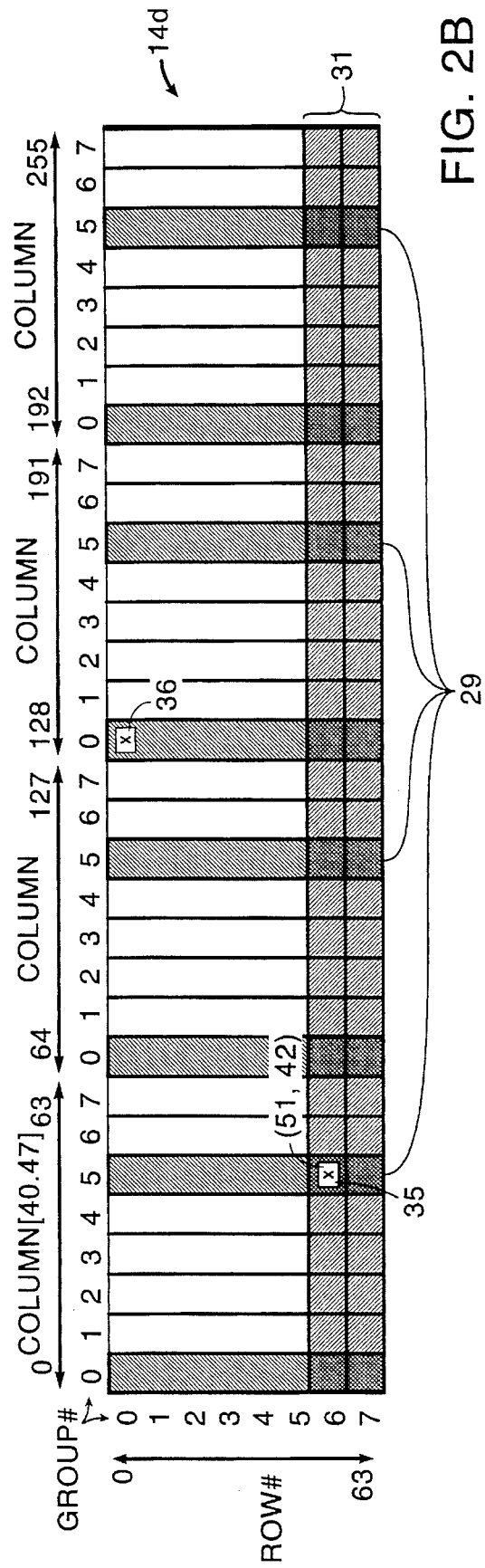
FIG. 2B illustrates an example of the selection of a portion of the memory sub-array of FIG. 2A to be replaced by redundant circuitry in the event of a defect in the memory sub-array.

Referring now to FIG. 2B, memory sub-array 14d is shown to include two clusters of defective cells 35 and 36, represented by boxed area X , where the first defective cluster of cells 35 includes a number of cells in rows 48–55 and columns 41–47 of logical Bit 0. The second defective cluster of cells 36 includes a number of cells in rows 0–7 and columns 0–7 of Bit 2.

To provide column redundancy, the arrangement according to the invention subdivides each 64 column bit partition for logical Bit 0 through Bit 3 as shown in FIG. 2A into 8 eight bit wide column groupings, shown here numbered column group 0–7. For example, for each logical bit, Bit 0–Bit 3, column group 0 includes bits 0–7, column group 1 includes bits 8–15, column group 2 includes bits 16–23, column group 3 includes bits 24–31, column group 4 includes bits 32–39, column group 5 includes bits 40–47, column group 6 includes bits 48–55 and column group 7 includes bits 56–63 (as illustrated). The first cluster of defective cells 35 is here shown to be included in column group 5, while the second cluster of defective cells 36 is here shown to be included in column group 0. The cluster of defective cells 35 can be repaired through row redundancy or column redundancy.

To perform column redundancy for the first cluster of defective cells 35, column group 5 of each logical bit (Bit 0 to Bit 3), shown shaded in FIG. 2B, and together here comprising defective group 29, is mapped into redundant storage 24. Although the defective group of cells is located in only Bit 0, here the column group for all four logical bits is mapped into redundant memory. Such an arrangement removes the logic complexity associated with allowing the memory array 14d to drive some of the logical bits, while the redundant storage drives the other logical bits of the data. It should be noted, however, that the design could be modified to allow the memory array 14d and either of the redundant storage units 24 or 34 to drive different portions of the data, thus resulting in a higher area efficiency at the cost of increased logic complexity.

To perform row redundancy for the first cluster of defective cells 35, row groups 6 and 7 for each logical bit (Bit 0 to Bit 3), shown shaded in FIG. 2B, and together comprising defective group 31, is mapped into both of the redundant storage units 24 and 34.

Although FIG. 2B shows the two defective clusters 35 and 36 to be in one sub-array 14d, it is to be understood that the redundant circuitry 20 provides storage for two defective clusters, each of which may be located in any of the sub-arrays 14a–14p.

Figure 3:
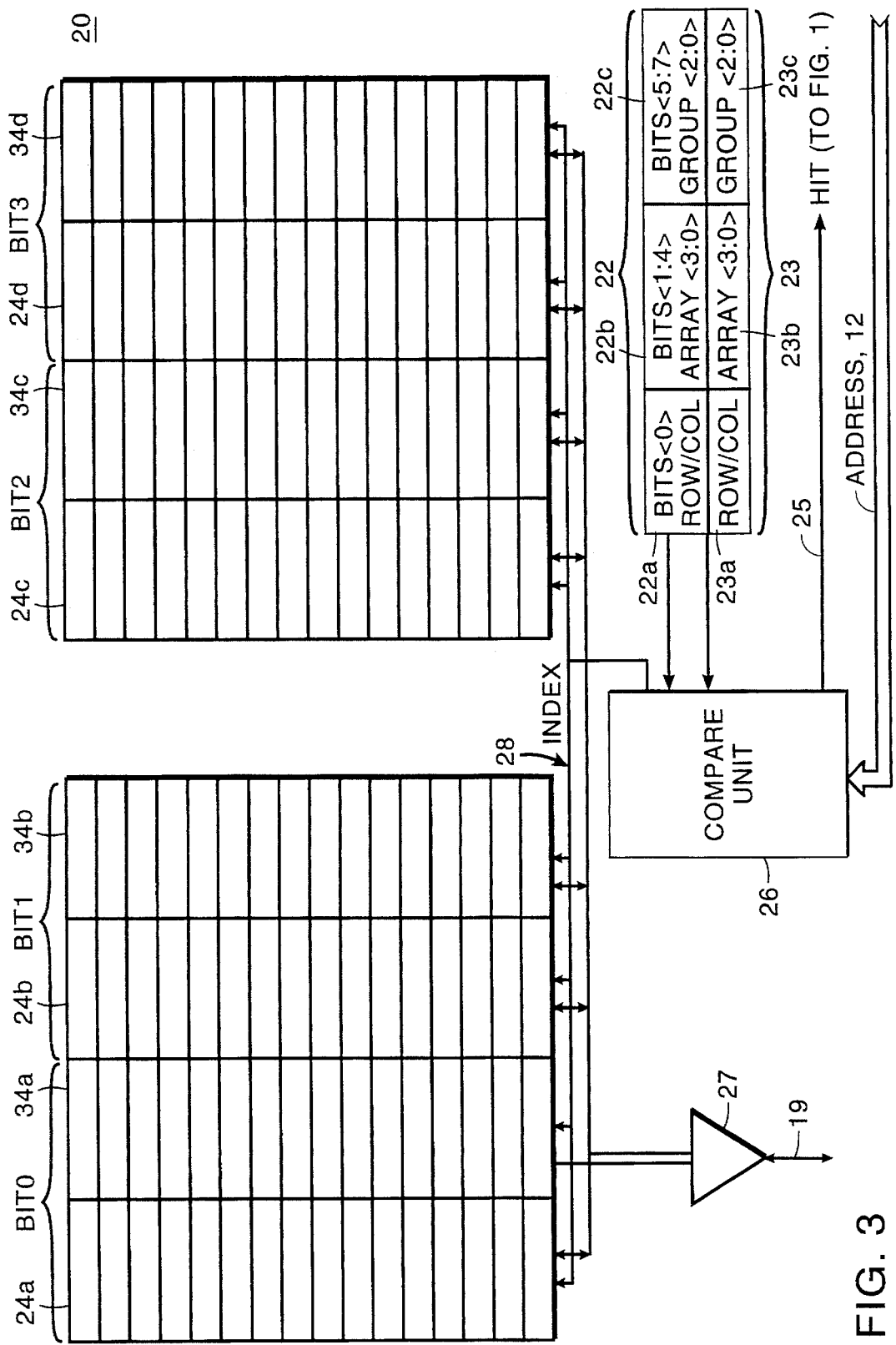
FIG. 3 is an exploded block diagram of the redundancy circuit of FIG. 1.

Referring now to FIG. 3, the redundancy circuit 20 of FIG. 1 is shown to include two storage devices each having 16 rows and 128 columns. To provide column redundancy, data for Bit 0, Bit 1, Bit 2, and Bit 3 from column group 5 (corresponding to defective cell cluster 35) are stored in redundant storage unit 24. Data for Bit 0, Bit 1, Bit 2, and Bit 3 of column group 0 (corresponding to defective cell cluster 36) are stored in redundant storage unit 34. It should be noted that the 16 row and 128 column arrangement shown in FIG. 3 is merely and example layout for the redundant storage units 24 and 34, and other configurations could similarly be implemented depending on the available space in the semiconductor package.

To provide column redundancy for defective group 29, column group 5 for each logical bit is mapped to the redundant storage unit 24 as shown in Table 1 below:

TABLE I

| ROW | BIT 0 (24a) COLUMN 0    31 | BIT 1 (24b) COLUMN 32    63 | BIT 2 (24c) COLUMN 64    95 | BIT 3 (24d) COLUMN 96    127 |
|---|---|---|---|---|
| 0 | ROW 0:3 COL 40:47 | ROW 0:3 COL 40:47 | ROW 0:3 COL 40:47 | ROW 0:3 COL 40:47 |
| 1 | ROW 4:7 COL 40:47 | ROW 4:7 COL 40:47 | ROW 4:7 COL 40:47 | ROW 4:7 COL 40:47 |
| 2 | ROW 8:11 COL 40:47 | ROW 8:11 COL 40:47 | ROW 8:11 COL 40:47 | ROW 8:11 COL 40:47 |
| . | . | . | . | . |
| 15 | ROW 60:63 COL 40:47 | ROW 60:63 COL 40:47 | ROW 60:63 COL 40:47 | ROW 60:63 COL 40:47 |

As indicated in Table I, the redundant stores 24 and 34 are each partitioned into 4 sub-stores 24a–24d, and 34a–34d respectively. Each sub-store stores the data for one of Bit 0 through Bit 3. Substores 24a and 34a store Bit 0 data for defective group 29 and defective group 39, respectively. Substores 24b and 34b store Bit 1 data for defective group 29 and 39, respectively. Sub-stores 24c and 34c store Bit 2 data for defective groups 29 and 39 respectively. Substores 24d and 34d store Bit 3 data for defective groups 29 and 39, respectively.

As shown in Table I, each row of the redundant store 24 stores 4 sub-array rows of the eight column bits of defective group 29. The four sub-array rows are laid out in the redundant store horizontally in ascending order, as shown below in Table II:

TABLE II

| Row 0 | Row 1 | Row 2 | Row 3 |
|---|---|---|---|

While, the above arrangement provides for storage of two clusters of defective cells, it is to be understood that the number of rows and columns, and the layout of the redundant storage units 24 and 34 could be altered to satisfy other design constraints.

In performing row redundancy, 2 row groups comprising 16 rows from a sub-array are directly mapped into the two redundant stores 24 and 34, essentially providing one large redundant store. For example, to provide redundant storage for the defective group of cells 35 (FIG. 2B), row groups 6 and 7 are directly mapped across redundant storage units 24 and 34 as shown in Table III below.

TABLE III

| | BIT 0 24a+34a | BIT 1 24b+34b | BIT 2 24c +34c | BIT 3 24d+34d |
|---|---|---|---|---|
| 0 | ROW 48 COL 0:63 | ROW 48 COL 64:127 | ROW 48 COL 128:191 | ROW 48 COL 192:255 |
| . | . | . | . | . |
| 7 | ROW 55 COL 0:63 | ROW 55 COL 64:127 | ROW 55 COL 128:191 | ROW 55 COL 192:255 |

TABLE III-continued

| | BIT 0 24a+34a | BIT 1 24b+34b | BIT 2 24c +34c | BIT 3 24d+34d |
|---|---|---|---|---|
| 8 | ROW 56 COL 0:63 | ROW 56 COL 64:127 | ROW 56 COL 128:191 | ROW 56 COL 192:255 |
| . | . | . | . | . |
| 15 | ROW 63 COL 0:63 | ROW 63 COL 64:127 | ROW 63 COL 128:191 | ROW 63 COL 192:255 |

As stated with regard to column redundancy, modifications could be made to above described arrangement to provide different redundancy configurations to satisfy other design requirements.

Referring again to FIG. 3, the redundancy circuit 20 further includes a fusible address fields 22 and 23 each for storing 8 bits of information. For example, fusible fields 22a and 23a identify whether the cluster of defective bits is mapped using column redundancy or row redundancy, where bit position 0 is here a '0' value indicates row redundancy, and a '1' value indicates column redundancy. Fusible fields 22b and 23b further include a 4 bit field which identifies the sub-array (14a–14p) in which there is a cluster of defective bits. Fusible fields 22c and 23c also include a 3 bit field which identifies which of the eight column or row groups (as shown in FIG. 2B) are stored in the redundant storage units 24 and 34.

The fusible address fields 22 and 23 comprise fuses which may be conductive and which are blown open by laser beam after the testing has determined the location of defects. Alternatively, a Programmable ROM device or a resistive link which is electrically programmed (blown) could be used. In any event, in the above example describing column redundancy, where the first cluster of defective cells are in memory array 14d, (memory sub-array 3 [FIG. 1]), column group 5, the data stored by the fuses 22 are:

```
1       0011    101
|        |       |
Row/    sub-   column
Col     array  group
```

The compare unit 26 compares the information stored in either of the fuses 22 or 23 against the address field provided on bus 12 to determine if there is a match. For example, the address for a 64k×4 memory device comprises bits <15:0>. Using the memory array arrangement of FIG. 1, the address bits generally are encoded as follows:

```
Address Bit  |15 14 13 12 | 11 10 9 8 7 6 | 5 4 3 2 1 0|
             |            |               |           |
             Sub-Array index   Row address   Column address
```

The compare unit 26 generates a hit on any address which matches the fused addresses stored in fusible address fields 22 and 23. Due to the method of mapping bits into the redundant store, as described with reference to Table I and Table II, the bits of the fusible address fields 22 and 23 correspond to a specific subset of the address bits, and thus the compare of the two fields may be performed using a simple comparator. When using column redundancy, that is when the Row/Col fuse 22a is set to a '1' value, the fusible address bits 22b and 22c, which identify the defective array (0011) and the defective column group (101) respectively, correspond to the following bits of the address field:

```
Address Bit  |15 14 13 12 | 11 10 9 8 7 6 | 5 4 3 2 1 0|
             |            |               |            |
             Sub-Array index  Row address  Column address
                  |             |             |
             0  0  1  1   X XXXXX    1 0 1 X X X
```

Thus, any address including the bits 0011XXXXXX101XXX (where X represents bits whose values are later used to select the appropriate data from the bus) results in a match with the redundant store, and therefore the compare unit 26 need only compare address bits 15:12 against the fused array bits 22b and address bits 5:3 against the fused group bits 22c for column redundancy for determining a match using column redundancy.

In the event of a match, the compare unit 26 then provides a 10 bit index, <R9:R0> to the redundant storage units 24 and 34. The index is derived as follows. Because the redundant store is here laid out having 16 rows, 4 bits of the address field are used to decode the redundant store row. These four bits may be directly accessed from bits 11:8 of the address provided on the address bus 12, and are used to provide bits <R9:R6> of the index.

Due to the layout of the memory redundancy circuits as shown in FIG. 3, where redundancy circuits 24 and 34 are interleaved, the compare unit 26 provides index bit <R5> to select the appropriate redundant store location. Index bit <R5> is determined by providing a 0 if the address on bus 12 matched the address in fusible fields 22, or providing a 1 on bus 12 in the event that the address on bus 12 matched the fusible fields 23.

Index bits <R4:R3> map directly to bits <7:6> of the address on bus 12 to select one of the four rows of the defective group. In addition, once the correct array row for each redundant store row is determined, the appropriate bit of the array row is selected by directly mapping bits <2:0> of the address on address bus 12 to bits <R2:R0> of the redundant store index. Thus, using column redundancy, the compare unit provides an index as follows:

```
Addr Bit  |15 14 13 12 | 11 10 9 8 7 6 | 5 4 3 2 1 0|
(bus 12)  |            |               |            |
          Array index   Row address     Column address
              |             |                |
          0   0  1  1   X  X  X  X  X1  0 1  X  X X
              |  |  |  |  |  |  |            |  |  |
Index Bits    R9 R8 R7 R6 R4 R3            R2 R1 R0
(bus 28)
*R5 provided by compare circuit 26
```

For example, given a read address of 0011.001010.101110, (array 3, row 10, column 46) the index address is 0010010110. As described above, bits <R9:R6> are the row address for the redundant storage unit 24, and comprise bits <11:8> of the address from address bus 12. Bits <7:6> and bits <2:0> of the address from address bus 12 map directly to bits <R4:R0> of the index, to provide the column address for the redundant storage unit 24. Index bit R5 is a 0 since the compare circuitry matched on the address in fusible fields 22 corresponding to defective group 29 (FIG. 2B).

When performing row redundancy for the example of FIG. 2B, the mapping of the redundant address is achieved as follows.

```
0       0011     110
|        |        |
Row/    sub-     row
Col     array    group
```

The Row/Col fusible field 22a is set to a '0' value to indicate that row redundancy is provided. As in column redundancy, fusible field 22b corresponds to the sub-array address, bits <15:12> of bus 12. The row group number, stored in fusible bits 22c, is defined by bits <11:9> of address bus 12. Because two consecutive row groups are provided for each defective cluster, the lower order bit of the row group number is not necessary for determining a match, but is included in the redundant store index. Therefore, address bits <11:10> are used to select the appropriate pair of rows in the redundant store. Thus, address bits <15:12>, and bits <11:10> are used by the compare unit 26 to determine whether there is a 'Hit' in the redundant store 24.

The redundant index bits <R9:R0> for a redundancy circuit 20 using row redundancy are derived as follows. Because the redundant rows are mapped directly from the memory sub-array, the addressing of the redundant store is facilitated and bits <9:0> of the address on bus 12 maps directly to the index bits <R9:R0> as shown below.

```
Address Bit  |15 14 13 12 | 11 10 9 8 7 6 | 5 4 3 2 1 0|
             |            |               |            |
             Array index   Row address     Column address
                 |          | | | | |       | | | | | |
             Array match   Row Group | | |  | | | | | |
             (fuse 22b)    (fuse 22c) | |   | | | | | |
                                      | | | | | | | | |
                           Index<R9>  | | | | | | | | |
                               Index<R8:R6>   Index<R5:R0>
```

The above described indexing method provides straight-forward design technique which allows fast access of the redundant store while the precharge period for the memory sub-arrays is being satisfied, and therefore adds no delay to the semiconductor memory device access time.

It should be noted that in this embodiment, either two defective clusters of cells are mapped using column redundancy, or one defective cluster is mapped using row redundancy. This is due to the differences in address mapping inherent between the column and row redundancy methods and the specific organization used for this design. The design, however, could be modified to allow for both types of redundancy to be stored in the same redundancy circuit by increasing logic complexity in the index address path.

Referring again to FIG. 1, a read operation to the semiconductor device 10 operates as follows. An address is received on address bus 12 with a chip select signal and a read or write (W/R) indication. Upon receipt of these signals, the memory sub-arrays are precharged for a period of time, typically 5 nanoseconds. During this precharge period, the decoders 13a–13p decode the address on bus 12 while the compare unit 26 determines whether there is a HIT in the redundant store. The HIT status is available and the address decoding is completed towards the end of the precharge period.

When the precharge period has been satisfied, output bus drivers 18a in secondary interface 18 are turned off to preclude the sub-arrays from providing unwanted data and noise to the output pins. After the output driver is disabled, the appropriate sub-array is accessed by the decoders 13a–13p and the data is provided on the 256 bit bus 15, and into the primary and secondary interfaces.

Concurrently, the compare unit 26 provides the index bits on bus 28 and control bits on bus 30, and redundant stores 24 and 34 provide data to the output drivers 27. As the sub-array data arrives at the secondary interface 18, the HIT signal is used in conjunction with the address bus on address bus 12 to turn on either the bus drivers 18a or bus drivers 27 depending on the status of the incoming addresses on address bus 12 and the HIT signal. If there is a HIT, the bus drivers 18a in the secondary interface are not enabled, instead the output bus drivers 27 from the redundancy circuit 20 are enabled to provide the data to input/output bus 19.

In the event of a miss in the redundant store, the data is obtained directly from the addressed sub-array. When there is no HIT in redundant storage, the bus drivers 27 are not enabled, and therefore no excess power is consumed by the redundant storage device during a miss. Hence, the redundant store device remains in a pre-charge state, awaiting the next access.

A write operation to the semiconductor device 10 in the event of a HIT in the redundant store operates as follows. An address is received on address bus 12, along with control signals on bus 12a indicating a write operation. The sub-arrays are precharged for a pre-charge period, during which time the decoders 13a–13p decode address bus 12, and the compare unit 26 determines whether there is a HIT with the redundant storage units 24 and 34. Towards the end of the precharge period, the HIT status is determined, and the drivers 18a and 27 are enabled to receive data from input/output bus 19. The data from input/output bus 19 is then written to both the redundant store 24 or 34 and the appropriate sub-array address, where the sub-array index bits are provided from the address on bus 12 as described previously with reference to FIG. 3.

In the event of a miss in the redundant store during a write operation, the data is written only to the appropriate sub-array designated by the address on bus 12.

In summary, the described arrangement allows for any number of redundancy circuits 20 to enable different configurations of columns or rows for any number of bits depending on where the defects in the memory array are located.

The described arrangement provides numerous advantages over previous redundancy techniques for semiconductor memory arrays. First, by separating the addressing of the redundant memory from the main array, the redundancy circuit 20 is organized for any matter type of replacement, including replacement of blocks or small strands for either columns or rows. This increased flexibility removes the necessity of allocating extra space in a given array simply for redundancy purposes.

In addition, by separating the redundant storage from the memory arrays, the time necessary for accessing a memory array is reduced, because the match circuitry is totally separated from the accessing of the memory array. Thus, any unnecessary logic functions are removed from the address path for the memory arrays.

An additional benefit is that the power consumption of this arrangement is minimized because the redundant storage is generally a small memory which utilizes a small amount of current, and therefore does not overly increase the power consumption of the memory device in the event of a HIT in the redundant store. For example, in the described arrangement, the redundant storage is only 4k bits, as opposed to accessing a 64k×4 bit memory array. Here, the power consumption increases by 8% only when there is a HIT in the redundant store, as opposed to an overall power increase for driving the redundant store for each memory operation. Moreover, because only 1.5% (4K of the entire 256K memory storage space) of the sub-array addresses are replicated in the redundant store and may incur the resulting 8% power increase, there is essentially no net power increase over the entire address space.

An additional benefit of the described arrangement is that, because the redundant storage may be totally separated from the control and addressing of the main arrays, the semiconductor memory device may be arranged such that the redundancy circuit is located in any available location on the die area. Thus, even for memory devices having a wide data path, the necessity of providing a wider package simply for providing column redundancy circuit is eliminated.

Having described a preferred embodiment of the invention, it will now become apparent to one of skill in the art that other embodiments incorporating its concepts may be used. It is felt, therefore, that this embodiment should not be limited to the disclosed embodiment, but rather should be limited only by the spirit and scope of the appended claims.

What we claim is:

1. A memory device comprising:
   a memory array comprising a plurality of sub-arrays each sub-array having a plurality of rows and columns, each sub-array coupled to an address bus and a data bus;
   means, coupled to said data bus, for receiving data from said data bus and providing said data to an output of said memory device, said means for receiving further comprising means for providing data from said output of said memory device to said data bus; and
   a storage device, coupled to said address bus and said output, for storing data corresponding a plurality of selected addresses;
   means, responsive to one of said plurality of selected addresses being provided on said address bus, for providing data to said data bus from said storage device;
   means for storing said plurality of selected addresses; and
   means for comparing an address on said address bus against said stored plurality of selected addresses, including means for providing an index to said storage device in the event that said address on said address bus matches said stored plurality of selected addresses to enable said storage device to provide data to said output of said memory device and to receive data from said output of said memory device.

2. The memory device of claim 1 wherein said plurality of selected addresses correspond to a subset of data locations of said memory array.

3. The memory device of claim 2, further comprising:
   means for precluding said main memory array from providing data to said output of said memory device in the event that said address on said address bus matches one of said stored plurality of selected addresses.

4. The memory device of claim 2, wherein said subset of data locations includes at least one defective data location of said memory array.

5. The memory device of claim 2, wherein said subset of data locations comprises locations from a plurality of consecutive columns for each of said rows of said defective array.

6. The memory device of claim 2, wherein said subset of data locations comprises locations from a plurality of consecutive rows for each of said columns of said defective array.

7. An apparatus comprising:
   a memory device comprising a plurality of memory arrays;

an address bus, coupled to said memory arrays;

a data bus, coupled to said memory arrays;

a first output driver, coupled to said data bus;

at least one data storage device coupled to said address bus;

an address storage device for storing a plurality of addresses related to said data storage device;

a second output driver coupled to said data bus; and a comparator for comparing an address on said address bus with said plurality of stored addresses, said comparator comprising means, responsive to a match between said address on said address bus and one of said plurality of stored addresses, for precluding said first output driver from providing data to said output data bus and for allowing said second output driver to drive said output bus.

8. The apparatus of claim 7, wherein said data storage device has a predetermined area comprising a first number of rows and a second number of columns, wherein said first number and said second number are determined relative to an available area of said memory device and said predetermined area of said storage.

* * * * *